US008816892B2

(12) United States Patent
Huang et al.

(10) Patent No.: US 8,816,892 B2
(45) Date of Patent: Aug. 26, 2014

(54) SEGMENTED COLUMN-PARALLEL ANALOG-TO-DIGITAL CONVERTER

(71) Applicants: Steven Huang, Pasadena, CA (US); Ramy Tantawy, Pasadena, CA (US); Daniel Van Blerkom, Altadena, CA (US); Barmak Mansoorian, La Canada, CA (US)

(72) Inventors: Steven Huang, Pasadena, CA (US); Ramy Tantawy, Pasadena, CA (US); Daniel Van Blerkom, Altadena, CA (US); Barmak Mansoorian, La Canada, CA (US)

(73) Assignee: Forza Silicon Corporation, Pasadena, CA (US)

( * ) Notice: Subject to any disclaimer, the term of this patent is extended or adjusted under 35 U.S.C. 154(b) by 0 days.

(21) Appl. No.: 13/656,674

(22) Filed: Oct. 20, 2012

(65) Prior Publication Data

US 2014/0077986 A1 Mar. 20, 2014

Related U.S. Application Data

(60) Provisional application No. 61/703,073, filed on Sep. 19, 2012.

(51) Int. Cl.
*H03M 1/34* (2006.01)

(52) U.S. Cl.
USPC .......................................... 341/163; 341/118

(58) Field of Classification Search
USPC .......... 341/155, 144, 163, 154, 118, 120, 156
See application file for complete search history.

(56) References Cited

U.S. PATENT DOCUMENTS

| | | | | |
|---|---|---|---|---|
| 4,200,863 A | * | 4/1980 | Hodges et al. | 341/156 |
| 5,258,761 A | * | 11/1993 | Fotouhi et al. | 341/172 |
| 7,158,070 B1 | * | 1/2007 | Yang et al. | 341/163 |
| 8,358,361 B2 | * | 1/2013 | Hasegawa | 348/300 |
| 2006/0098032 A1 | * | 5/2006 | Nakahira et al. | 345/690 |

* cited by examiner

*Primary Examiner* — Peguy Jean Pierre

(57) ABSTRACT

A successive approximation A/D converter which includes a sub ranging classifier that receives an input signal and classifies said input signal according to plural different highest resolution bits, to determine a range of the input signal, and creating a set of most significant bits based on said range, said subranging classifier also setting and determining an offset based on said range, and a successive approximation A/D converted that converting lowest resolution parts of the input signal as adjusted by the offset.

16 Claims, 6 Drawing Sheets

SEGMENTED COLUMN-PARALLEL ANALOG-TO-DIGITAL CONVERTER

This application claims priority from provisional application No. 61/703,073, Sep. 19, 2012 the entire contents of which are herewith incorporated by reference.

BACKGROUND

The demand for high resolution, high frame rate, high dynamic range and low noise CMOS image sensors continues to push the technology of our pixel readout circuitry. For next generation CMOS image sensors, we see an increase requirement for higher resolution ADCs pushing up towards 16 bits.

The need for low noise, high bit resolution becomes especially important in low light levels, where the readout noise may not be dominated by photon shot noise.

In such CMOS image sensors, the signal noise is dependent on the signal level. For example, for CMOS image sensors, the noise is proportional to:

$$\text{Noise} = \sqrt{(\text{readnoise})^2 + (\text{signal})}$$

Note that this noise value is typically effective at all signal levels. The signal dependent portion of the noise is called the "shot noise".

Because of this relationship, the ADC used to digitize the light can have a lower resolution at higher light levels than it has at lower light levels.

FIG. 1 shows how ADC quantization noise hence scales with the input signal. Specifically, as shown in FIG. 1, the quantization noise shown as 100 scales upward as the input voltage to a successive approximation A/D converter increases. For example, the section 105 of the curve shows the quantization noise for a nine bit A/D conversion. This is more or less linearly increasing as the input voltage increases. In a similar way, the section of the curve 110 shows how the quantization noise scales upward in a higher bit A/D converter.

SUMMARY

The present application describes a hybrid successive approximation A/D converter which provides a scaled conversion, to provide a device which has a good resolution at low light and a loosened resolution as the level of light increases.

According to an embodiment, the variable resolution at a higher signal levels can provide faster and lower power consumption A/D converters.

Embodiments describe specific circuitry for use in these kinds of devices.

BRIEF DESCRIPTION OF THE DRAWINGS in the drawings.

DETAILED DESCRIPTION

The inventors recognized that as the ADC resolution increases further, there are several key design challenges to overcome. First, the area taken up by the DAC increases by $2^N$ number of bits. By using a multiple number of reference voltages, this can limit the largest capacitor size needed for the most significant bit. However, the main drawback is then shifted towards generating accurate voltage references to achieve good A/D converter performance. A second challenge is overcoming the capacitor ratio matching requirement. For an N-bit converter, the capacitor ratios should match to N-bits. This becomes more difficult for narrow pitch layouts and small pixel dimensions. Third, with larger and larger pixel array sizes, the voltage reference settling becomes difficult, particularly with increasing capacitor sizes.

Figure 1:
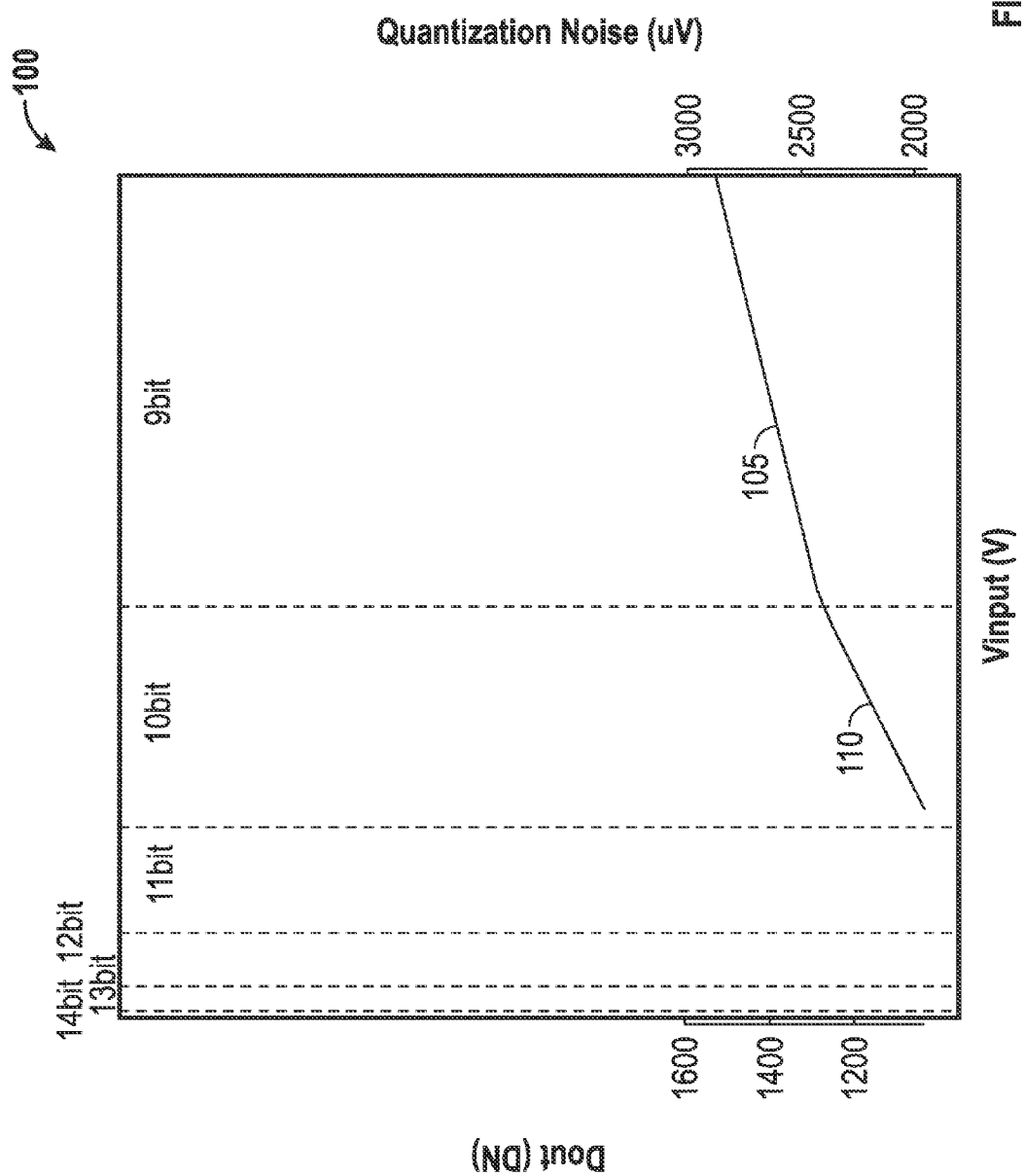
FIG. 1 shows a drawing of ADC quantization noise and how it scales with the input signal.
Figure 2:
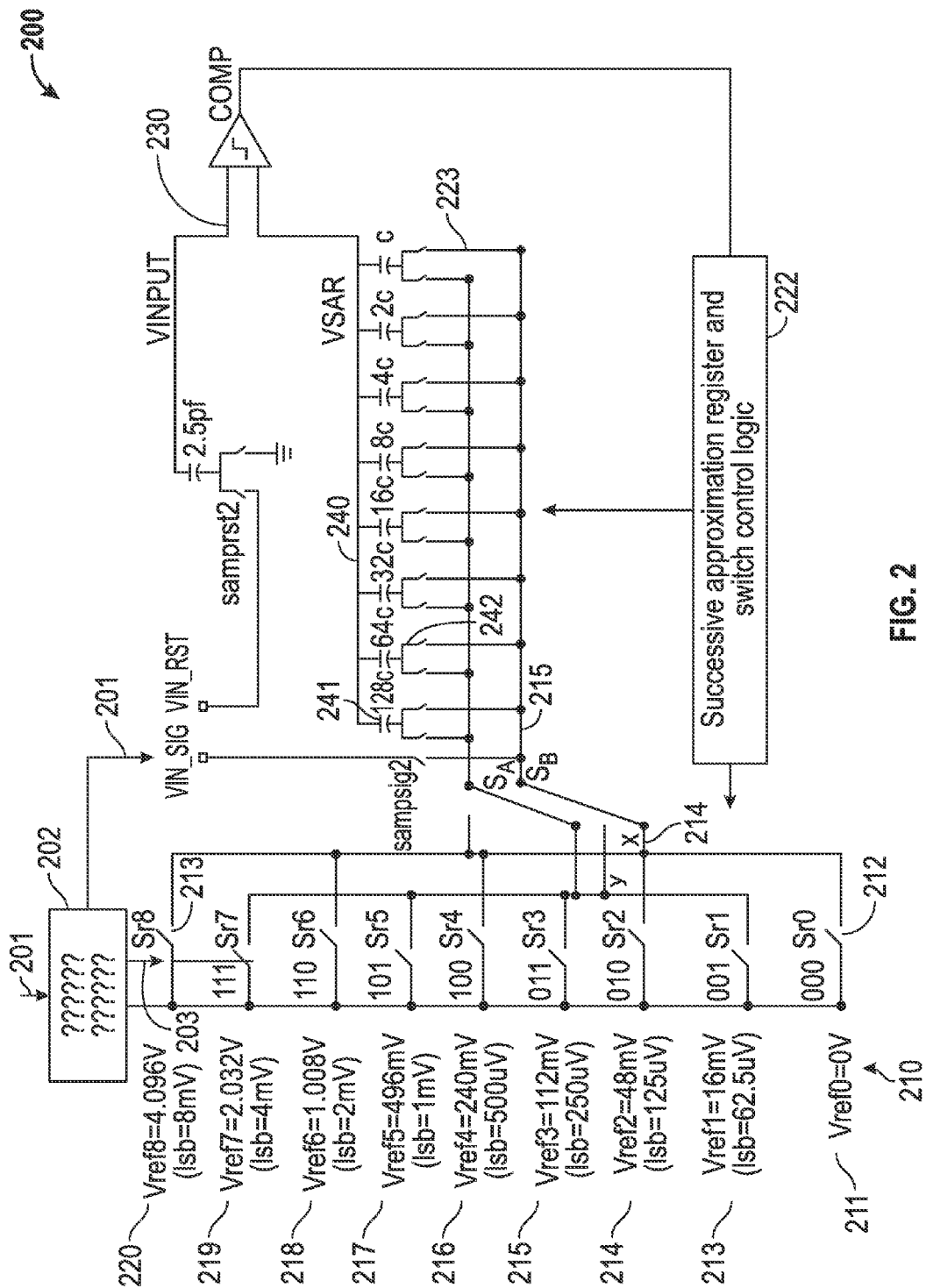
FIG. 2 shows a block diagram of a successive approximation A/D converter according to the present system.

FIG. 2 shows a block diagram according to an embodiment of a multi-segmented SAR where each segment's ADC resolution is adjustable with varying voltage reference levels. According to this embodiment, a hybrid successive approximation A/D converter is described that provides improved resolution at low light input levels and loosened resolutions as the signal level increases. The block diagram of FIG. 2 shows selection logic 222 for the multiple sub-ranging segments. Once a segment is selected, the residual is converted by fine successive approximation registers 223 with a high gain comparator 230.

According to an embodiment, each incoming pixel, or each group of incoming pixels may be initially sub ranged according to its level. For example, each of the pixels may be classified according to a photon transfer curve of the pixel that is based on its specific level. In operation, an incoming pixel level 201 is first classified by a sub ranging classifier 202.

This embodiment uses a total of 8 segments that resolves the coarse 3 most significant bits of the ADC. The conversion of the coarse bits is performed with a binary search such that only 3 comparisons are needed. This selects a "segment" and after the segment is selected, the reference voltage associated with that segment is reused as the reference to resolve the remaining fine bits. The reference voltages, as described herein, are nonlinear. The first stage is nonlinear, in a way that takes advantage of the nonlinear photon transfer curve or shot noise. By subranging in a nonlinear way, improved resolution can be obtained. By routing the reference voltage in this approach, the settling of the ADC reference voltages no longer depends on the total column size.

As an alternative, the sub ranging classifier 202 can use a flash conversion technique, where the input signal is compared to each of $2^n$ different levels, where here n is three, and this number of different comparators determines the location of the signal.

However classified by the classifier 202, the signal is then classified according to its level. This level creates an offset level which is used to convert the signal. After setting this also, the remaining lowest resolution bits are resolved within successive approximation registers using a Charge-redistribution successive approximation ADC shown as 240 and explained herein.

Sub ranging classifier 202 produces an output 203 that controls the selection logic 210 to produce an offset based on the determined selection level. The offset is controlled by controlling one of the eight switches shown at generically as 212 in FIG. 2 to add an offset based on the sub range classification to the signal. That offset is non linear in a way that compensates for an amount of photon shot noise.

The fine 8-bit conversion is done using a successive approximation technique with binary weighted capacitors shown as 240.

In an embodiment, the ADC uses a 5V/1.8V process and the ADC reference voltage is set at 4V. The maximum voltage for the ADC in this embodiment is 4V and for the sub ranging the highest reference we use is 219, 2.032V. If the input signal is higher than 2.032V, the most significant 3 bits is selected as "111" and the 2.032V is used. So for the sub-ranging portion of the conversion, only Sr0 to Sr7 have the possibility of being used.

The lowest segment starts at 16 bit resolution and each subsequent segment doubles in LSB size. The LSB size in this embodiment is set at 62.5 uV, so the vref1, element 213, is set to 16 mv (setting the 1 sb to be 62.5 uv). In a similar way, each subsequent reference doubles; vref2, 214, being 48 mv for a 1 sb of 125 uv, vref3, 215, being 112 mv for a 1 sb of 250 uv; vref4, 216, being 240 my for a 1 sb of 500 uv; vref5 being 498 my for a 1 sb of 1 mv, vref8 being 1.008V for an 1 sb of 2 mv; vref7 being 2.032 v for an 1 sb of 4 mv and vref8 being 4.098 v for an 1 sb of 8 mv.

Taking an example of an input signal whose maximum voltage is 4 V, the subranging classifies between a first classification for the 4 volt signal being within the top end of its range, that is the most significant bits being 111. Thus, when the classifier 202 detects that the signal will have the highest significant bits being 111, then the reference voltage 219, here 2.032 V, is selected by closing the switch Sr7. This switches the signal from 219 to the node 214, thereby switching it to the capacitors 240 in the successive approximation register. In a similar way, other signals can be sub ranged by the sub range classified, and used with different reference levels, including reference level 218, 1.008 V for the most significant bit value of 110. The reference level 217 uses a reference level 496 mV for a most significant bit level of 101. The reference level 216 uses a level of 240 mV for its most significant bit level of 100. The reference level 215 uses a level of 112 mV for the most significant bit level of 011. The reference level 214 uses a level of 48 mV for the most significant bit level of 010. The reference level 213 uses a level of 18 mV for the most significant bit level of 001.

After selecting one of the offsets and appropriately offsetting the input signal 201, the offset data 215 (representing only the lowest significant bits) is converted using the capacitor bank/successive approximation registers shown as 240 and comparator 230.

The charge-redistribution successive approximation ADC 240 uses a charge scaling DAC. The charge scaling DAC includes an array of individually switched binary-weighted capacitors 241, 242. Each capacitor such as 241 is double the level of the capacitor 242 before it, thus leading to a binary weighted capacitor bank. The amount of charge on each capacitor in the array is compared using the high accuracy comparator 230 internal to the DAC and the successive approximation register.

In operation, first, the capacitor array may be first discharged to the offset voltage of the comparator. Next, the offset, as determined by the subranging, may be applied onto all the capacitors, by closing the selected switch such as 213. Next, all of the capacitors within the array are switched to the input signal, vIN. The input signal will have the opposite sense to the offset level, and thus the offset level will cancel a portion of the input signal, reducing the dynamic range of the input signal. The capacitor bank 240 now has a charge applied, with each chare on each capacitor equal to their respective capacitance times the input voltage minus the offset voltage upon each of them.

The capacitors are then switched so that this charge is applied across the comparator's input, creating a comparator input voltage equal to −vIN.

The conversion process proceeds by first switching the MSB capacitor to VREF, which corresponds to the full-scale ranged voltage of the ADC obtained by the subranging. Due to the binary-weighting of the array, the MSB capacitor 241 forms a 1:1 division between it and the rest of the array. Thus, the input voltage to the comparator is now −vIN+VREF/2. Subsequently, if vIN is greater than VREF/2 then the comparator outputs a digital 1 as the MSB, otherwise it outputs a digital 0 as the MSB. Each capacitor is tested/sampled in the same manner until the comparator input voltage converges to the offset voltage, or at least as close as possible given the resolution of the DAC.

After the segment is selected, the reference voltages of that segment are reused as the reference to resolve remaining fine bits. For example, if reference 213 is selected, then the highest significant bits become 001, and the reference voltage 16 mV is used as the reference voltage in the successive approximation logic and switch control.

In addition, normal successive approximation devices of this type fix the reset side to a bias/reference voltage. Therefore, that one side always gets the bias voltage. According to the present system, of the input line actually samples the reset level 266. The reset level is sampled by closing the switch 267 thereby sampling the reset level onto the capacitor 268. The capacitor uses the same reference as a successive approximation reference, so the successive approximation side of the comparator to 30 forms a differential system with the input voltage 268. By so doing, this rejects noise on the system since all the noise is on both sides.

Figure 3:
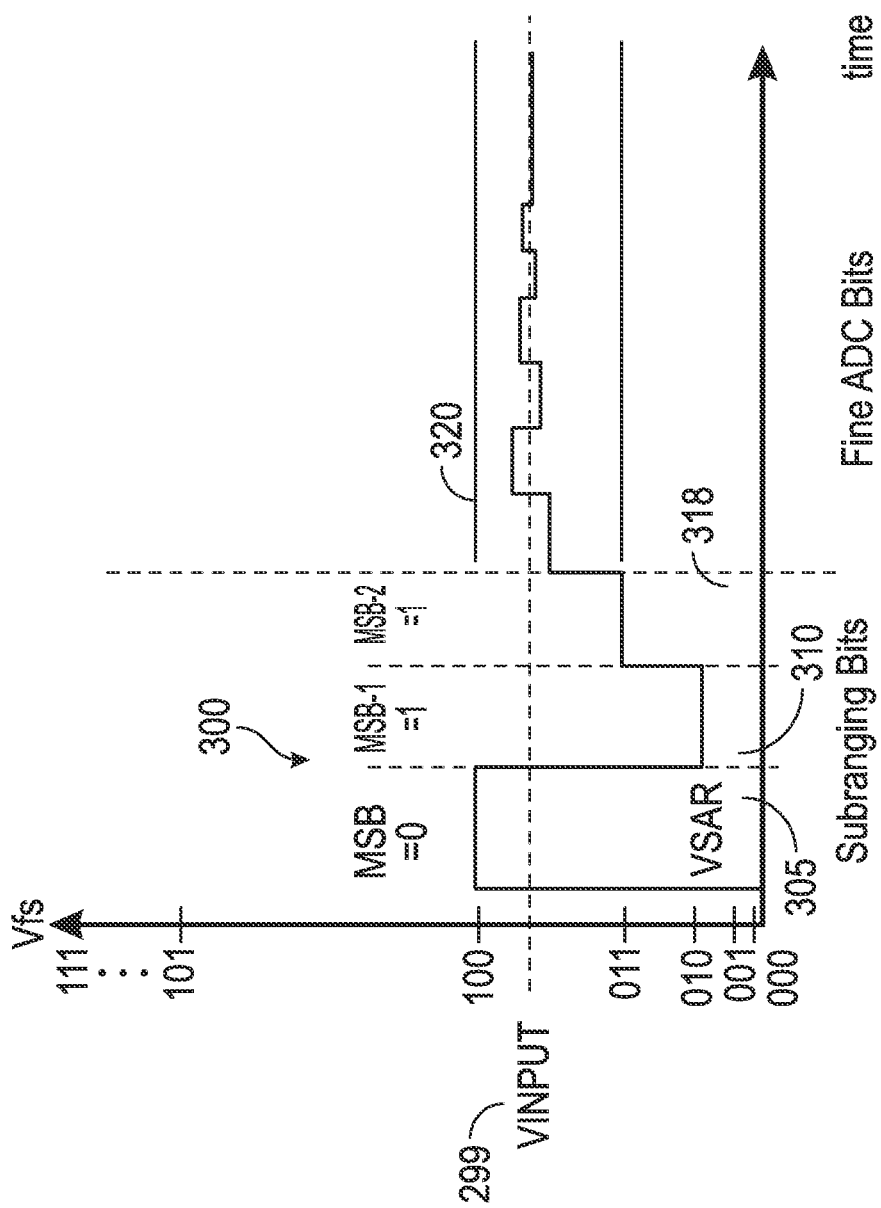
FIG. 3 shows a flow diagram of the A/D conversion process.

FIG. 3 shows a flowchart of the subranging process that is used. The sub ranging fit is first found in the first part of the process 300. The voltage input 299 is compared against first the mid-level bits. The first comparison at 305 determines if the voltage input is higher or lower than that mid-level reference. Here it is lower, and hence the most significant bit is set to zero and the next comparison will compare against the value 010 at 310. After comparing at 310, voltage input 299 is found to be higher than this level, and hence the second most significant bit is set to one. At 315, the next comparison is made, therefore, to the next value 011. Again the comparison is found to be higher, so the most significant bit is set to one, making the most significant bits 011.

Since the most significant bits are 011, the switch SR3, 214 is closed, making the least significant bits 250 microvolts. The reference for 011, here 250 uv, is then used as the reference value for the fine A/D conversion process at 320, which is carried out using a the successive approximation technique described above.

The selection logic 210 may also choose a different photon transfer curves, based on the level of the signal.

In this example, there are total of eight segments that resolve the coarsest three most significant bits of the A/D converter. The conversion of the coarse bits is carried out by using the binary search, so that only three comparisons are needed. This may use comparators to compare with the different levels, and determine which of the levels is the best match.

Figures 4, 5:
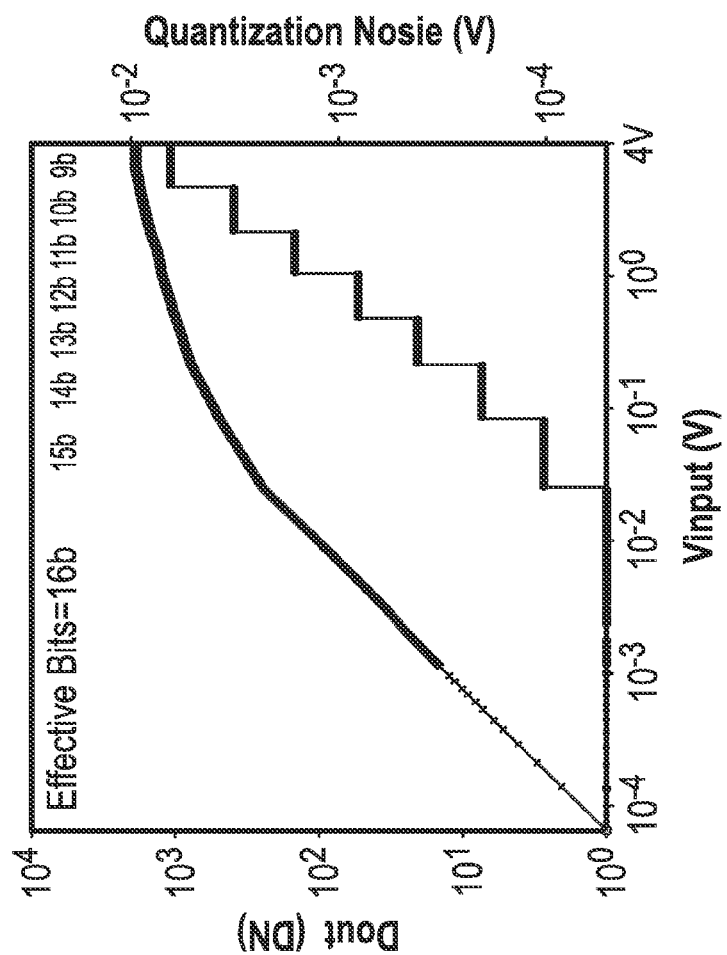
FIG. 4 shows the A/D conversion transfer function.
FIG. 5 shows a compendium lookup table which can be used according to the present application.

The transfer function of FIG. 4 can be used to compand the ADC transfer function relative to quantization noise vs. input signal level. A de-companding look up table as shown in FIG. 5 is used to linearize the output back to 16 bit levels. Different step sizes are fully adjustable said the transfer function can be adjusted to match any given sensors photon transfer characteristic. Then, the output can be linearized back to full 16-bit levels.

This embodiment addresses the challenges noted above. It addresses the challenge of DAC area by reducing the number of capacitors required to achieve high bit resolution. The number of total unit capacitor needed is set by the fine 8 bits in this embodiment, so this embodiment requires only 256 capacitor units. The second challenge of capacitor ratio matching is alleviated by the two step approach of the A/D conversion.

To address the third challenge of scalability, the reference voltages are routed periodically to external decoupling capacitors in a block design approach. Typically in column parallel designs, the ADC reference voltages are routed from only from the horizontal direction (left and right side) to the array. Therefore as the number of columns increases, so does the resistance of the routing from the edge of the array to the middle. This increase in resistance degrades the performance of the ADCs in the middle of the array. Our approach is to bring the references from the bottom side of the array periodically. We can now expand the number of column blocks and not worry about routing resistance to the middle of the array. A problem arises with this approach. Typically digital SRAM logic is sitting right under the ADC and references cannot be routed from the bottom side. To overcome this, the digital SRAM pitch is made to be smaller than the ADC and thus allowing a clean analog routing channel from the PADS to the ADC.

Figure 6:
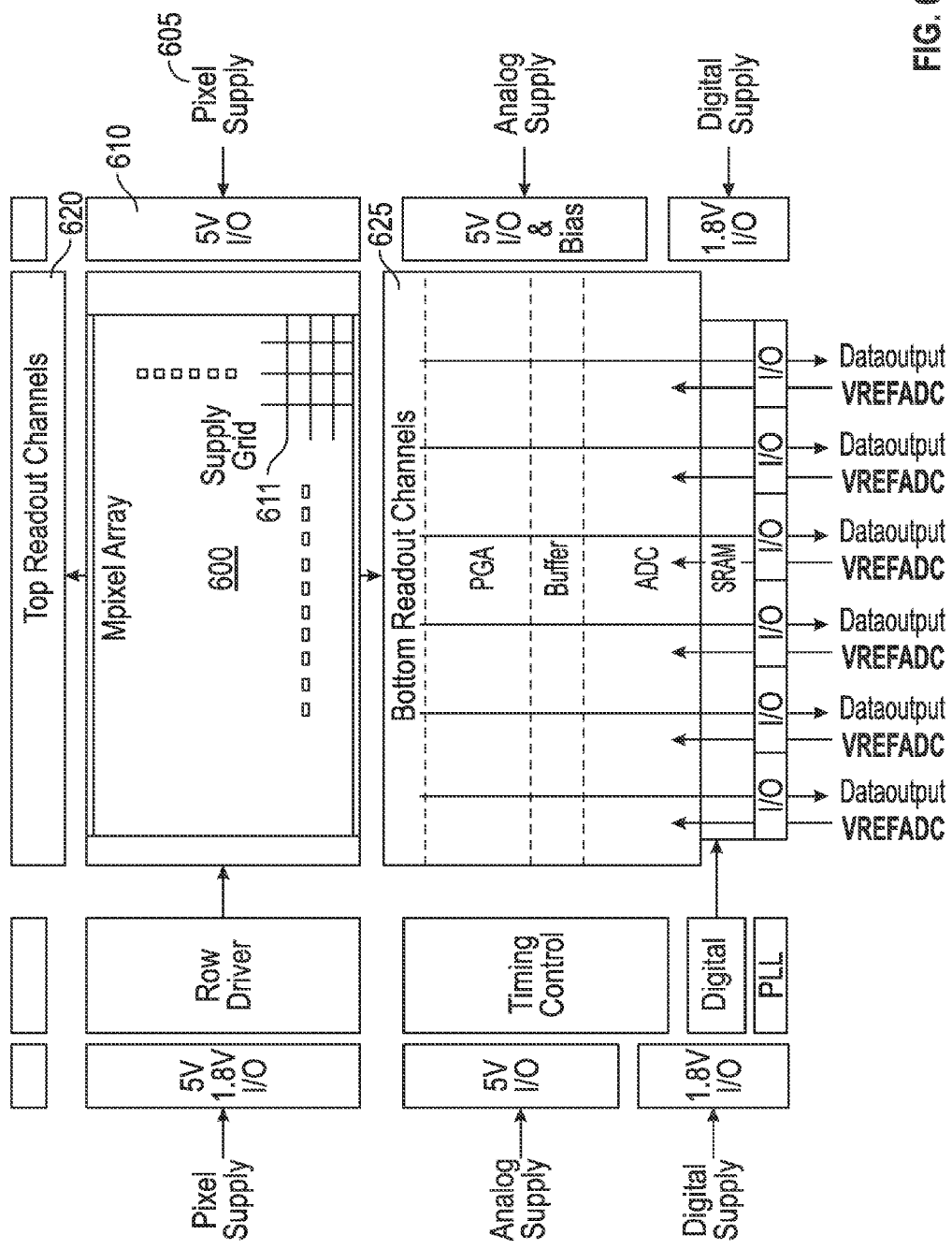
FIG. 6 shows a block diagram of an overall device.

FIG. 6 shows a block diagram of an image sensor device made using the techniques of this application. A pixel array 600 is supplied with the pixel power supply 605 through decoupling capacitor blocks 610 to a supply grid 611. There can be both top readout channel 620 and bottom readout channels 625. The readout channels may include the circuits 200 shown in FIG. 2. The voltages can be applied via decoupling capacitor blocks 610, which can switch in and out the decoupling.

One key advantage of the multi-segment SAR approach compared to that of the multiple slope ramping ADC is that the segments are set by DC reference voltages and not by time variant slopes. A DC reference voltage is easier to control in terms of variation from column to column. As long as the reference voltage settles during each successive approximation decision, issues with input signal dependencies are minimized.

Figure 7:
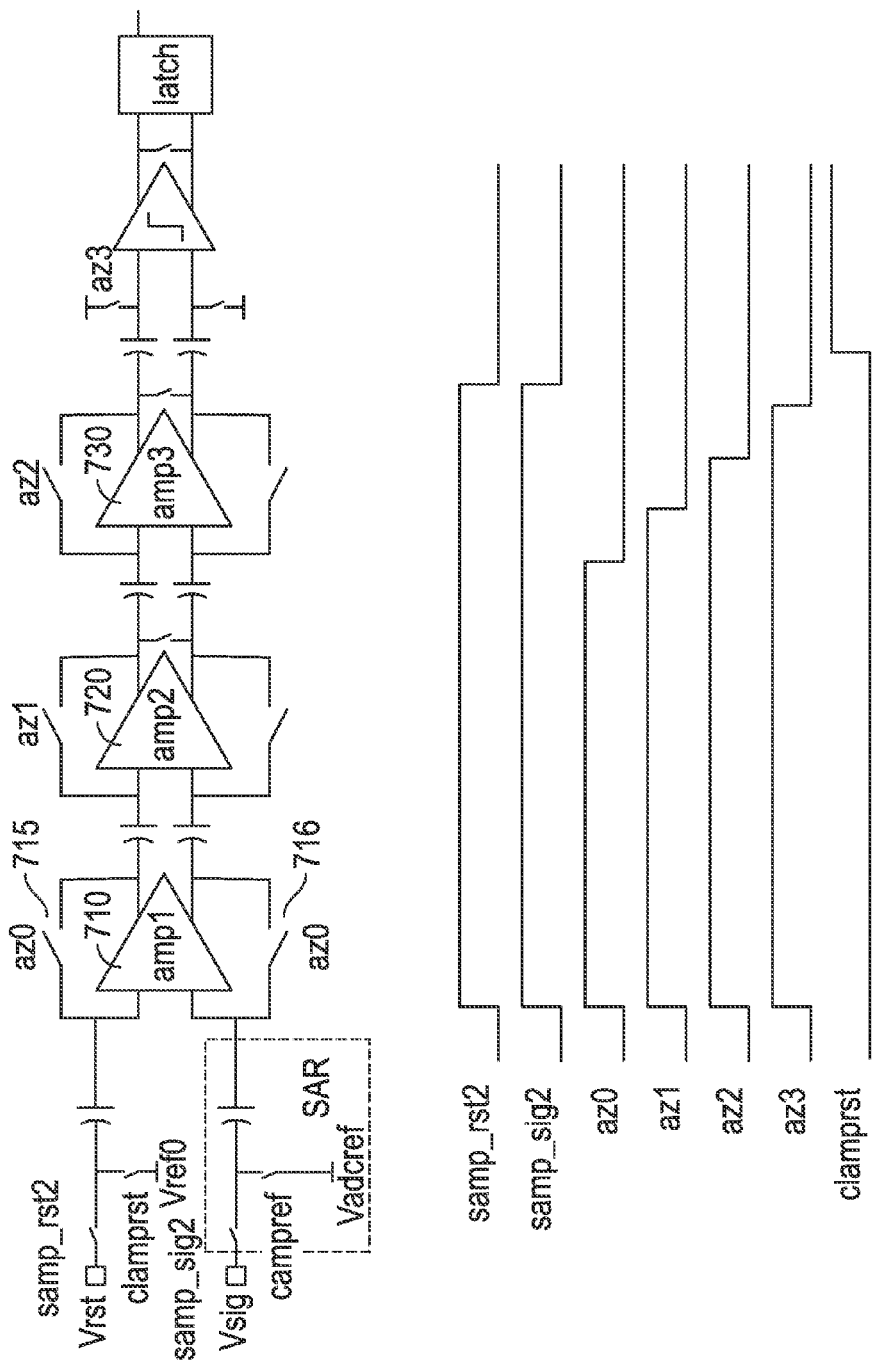
FIG. 7 shows a diagram and timing circuit for a comparator according to an embodiment.

FIG. 7 illustrates a multi stage preamp and comparator embodiment that may be used in the circuit of FIG. 2. In order to minimize the offset of the ADC down to the lowest segment LSB, a high gain preamplifier and comparator may be used. The gain of the overall preamp in the FIG. 7 embodiment is large enough to amplify the input signal and to overcome the offset of the comparator latch. This is done using three stages, each with an individual preamp, shown respectively as 710, 720, 730. Each preamp stage such as 710 has both input and output offset storage as well as charge injection output storage. The offsets of the preamps are not amplified while the charge injection from auto-zero switches 715, 716 are closed. During this time while the switches 715, 716 are closed, the inputs of the amplifier are zeroed to the outputs of the amplifier. Auto-zeroing charge injection is stored sequentially on each output capacitor after being divided by the gain of its preamp stage. The sequential switching in addition to bottom plate input capacitor sampling minimizes the residual charge injection remaining in this capacitive switching network.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other kinds of ADCs may be improved in a similar way.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form.

When operated on a computer, the computer may include a processor that operates to accept user commands, execute instructions and produce output based on those instructions. The processor is preferably connected to a communication bus. The communication bus may include a data channel for facilitating information transfer between storage and other peripheral components of the computer system. The communication bus further may provide a set of signals used for communication with the processor, including a data bus, address bus, and/or control bus.

The communication bus may comprise any standard or non-standard bus architecture such as, for example, bus architectures compliant with industry standard architecture ("ISA"), extended industry standard architecture ("EISA"), Micro Channel Architecture ("MCA"), peripheral component interconnect ("PCI") local bus, or any old or new standard promulgated by the Institute of Electrical and Electronics Engineers ("IEEE") including IEEE 488 general-purpose interface bus ("GPIB"), and the like.

A computer system used according to the present application preferably includes a main memory and may also include a secondary memory. The main memory provides storage of instructions and data for programs executing on the processor. The main memory is typically semiconductor-based memory such as dynamic random access memory ("DRAM") and/or static random access memory ("SRAM"). The secondary memory may optionally include a hard disk drive and/or a solid state memory and/or removable storage drive for example an external hard drive, thumb drive, a digital versatile disc ("DVD") drive, etc.

At least one possible storage medium is preferably a computer readable medium having stored thereon computer executable code (i.e., software) and/or data thereon in a nontransitory form. The computer software or data stored on the removable storage medium is read into the computer system as electrical communication signals.

The computer system may also include a communication interface. The communication interface allows' software and data to be transferred between computer system and external devices (e.g. printers), networks, or information sources. For example, computer software or executable code may be transferred to the computer to allow the computer to carry out the functions and operations described herein. The computer system can be a network-connected server with a communication interface. The communication interface may be a wired network card, or a Wireless, e.g., Wifi network card.

Software and data transferred via the communication interface are generally in the form of electrical communication signals.

Computer executable code (i.e., computer programs or software) are stored in the memory and/or received via communication interface and executed as received. The code can be compiled code or interpreted code or website code, or any other kind of code.

A "computer readable medium" can be any media used to provide computer executable code (e.g., software and computer programs and website pages), e.g., hard drive, USB drive or other. The software, when executed by the processor, preferably causes the processor to perform the inventive features and functions previously described herein.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A two-stage successive approximation A/D converter, comprising:
a first stage that subranges an input signal according to plural different levels, and a second stage that carries out a successive approximation A/D conversion using capacitors, where said capacitors are energized based on a non linear offset amount created by said first stage, that non-linearly provide more resolution toward a bottom end, wherein said offset is non linear in a way that compensates for an amount of photon shot noise.

2. The converter as in claim 1, wherein said first stage classifies said input signal according to plural different highest resolution bits, to determine a range of the input signal, and creating a set of most significant bits based on said range, and also setting and determining a non-linear offset based on said range.

3. The converter as in claim 1, wherein said second stage carries out a successive approximation A/D conversion by converting lowest resolution parts of the input signal as adjusted by the non-linear offset.

4. The converter as in claim 1, wherein said offset is selected by closing one of a bank of switches, said switches each controlling supply of an offset voltage, and where different switches each control a different amount of offset voltage.

5. The converter as in claim 1, wherein said successive approximation A/D conversion carried out by said second stage compares an adjusted input signal, adjusted according to said offset voltage, with a reference.

6. The converter as in claim 5, wherein said reference is sampled at every conversion time.

7. The converter as in claim 5, wherein said reference is a reset level that is sampled at every conversion time by sampling a reset level first onto a capacitor, and sampling a sample level second on to said capacitor, to form a differential between said reset level in said sample level on the same capacitor.

8. The converter as in claim 1, wherein said second stage uses 2N capacitors and said converter outputs more than N bits.

9. A method of successive approximation A/D converting, comprising:
first subranging an input signal according to plural different levels, that provide more resolution toward a bottom end;
using said subranging to select an offset signal, where said offset signal is non-linear between different levels selected by said subranging, wherein said offset is non linear by an amount based on photon shot noise, and
carrying out a successive approximation A/D conversion using capacitors, where said capacitors are energized based on said reference signal.

10. The method as in claim 9, wherein said first subranging classifies said input signal according to plural different highest resolution bits, to determine a range of the input signal, and creating a set of most significant bits based on said range, said subranging also setting and determining said non-linear offset based on said range.

11. The method as in claim 9, wherein said a successive approximation A/D conversion is carried out by converting lowest resolution parts of the input signal as adjusted by the offset.

12. The method as in claim 9, wherein said offset is selected by closing one of a bank of switches, said switches controlling different offset voltages, and where different switches each control a different amount of offset voltage.

13. The method as in claim 9, wherein said successive approximation A/D conversion compares an adjusted input signal, adjusted by said offset voltage with a reference.

14. The method as in claim 13, wherein said reference is sampled at every conversion time by sampling a reset level first onto a capacitor, and sampling a sample level second on to said capacitor, to form a differential between said reset level in said sample level on the same capacitor.

15. The method as in claim 13, wherein said reference is a reset level that is sampled at every conversion time.

16. The method as in claim 13, wherein said second stage uses 2N capacitors and said converter outputs more than N bits.

* * * * *